United States Patent [19]

Nortrup

[11] Patent Number: 4,622,481
[45] Date of Patent: Nov. 11, 1986

[54] DIGITAL ENVELOPE DETECTION CIRCUIT

[75] Inventor: Kevin E. Nortrup, Indianapolis, Ind.

[73] Assignee: RCA Corporation, Princeton, N.J.

[21] Appl. No.: 768,079

[22] Filed: Aug. 21, 1985

[51] Int. Cl.[4] .............................................. H03D 3/00
[52] U.S. Cl. ...................................... 307/522; 377/39; 377/107
[58] Field of Search ....................... 377/39, 54, 55, 56, 377/67, 107; 307/234, 522; 328/28, 30, 13, 26, 61, 135, 111, 112

[56] References Cited

U.S. PATENT DOCUMENTS

| | | | |
|---|---|---|---|
| 3,044,065 | 7/1962 | Barney et al. | 377/44 |
| 3,548,320 | 12/1970 | Roberts et al. | 377/107 |
| 3,980,960 | 9/1976 | Hutchinson | 307/234 |
| 4,137,504 | 1/1979 | Simmons | 328/112 |
| 4,330,751 | 5/1982 | Swain | 377/107 |
| 4,443,709 | 4/1984 | Genuit et al. | 307/41 |

FOREIGN PATENT DOCUMENTS 2658957 9/1977 Fed. Rep. of Germany .
57-204663 12/1982 Japan .

Primary Examiner—John S. Heyman
Assistant Examiner—Karl Ohralik
Attorney, Agent, or Firm—Paul J. Rasmussen; Eric P. Herrmann; Dilip A. Kulkarni

[57] ABSTRACT

This circuit provides a digital output indicating the presence or absence of the infrared (IR) carrier signal. The incoming IR signal is sampled by a clock at a frequency which is about 4 times the carrier frequency. The high and low samples are tabulated in two counters in a race. When 8 high or 16 low samples are counted, the envelope status flip flop is set or reset, respectively, and both counters are reset. The output of the envelope status flip flop represents the envelope of the IR carrier signal.

12 Claims, 3 Drawing Figures

DIGITAL ENVELOPE DETECTION CIRCUIT

This invention relates to a circuit for detecting the presence or absence of an infrared (IR) carrier signal.

BACKGROUND

Television receivers with remote control are becoming increasingly popular. The remote control hand unit enables the user to control the operation of the television receiver and other attachments—such as a VCR—without having to get up and touch the instrument.

In an RCA remote TV system, the remote control hand unit transmits messages to TV instrument in the form of successive bursts of an infrared (IR) carrier signal having a fixed frequency of 56.875 KHz and a period of 17.6 microseconds ($\mu$s). An IR message is composed of a MARK (a burst of IR, at least 4 millisecond or ms in duration), a SPACE (an absence of IR for 4 ms), and a SYNC pulse (0.5 ms of IR) followed by 24 DATA bits. The DATA bits, in turn, consist of a 4 PREAMBLE bits indicating the subject of the message (e.g., VCR, TV, etc.), then 8 COMMAND bits specifying the actual function to be performed, followed by the logical complement of the 4 PREAMBLE and 8 COMMAND bits. A logical "zero" and a logical "one" is encoded in the spaces separating the IR SYNC pulses of constant, 0.5 ms duration. For example, a logical "zero" and a logical "one" is respectively represented by the absence of the IR carrier signal for a period of 2 ms and 1 ms between consecutive SYNC pulses. Since the complement of every data bit is also transmitted, all messages are of a fixed, 56.5 ms duration.

In the television receiver, the IR carrier signal is sensed, amplified, band-passed and decoded. The decoding of the IR carrier signal comprises of three levels of signal processing—envelope detection (i.e., detection of the IR carrier bursts), bit decoding and message decoding. The present invention is directed to a circuit for detecting the presence or absence of the IR carrier envelope.

The envelope detection circuit, in accordance with this invention, includes first and second counters, which are both clocked at four-microsecond intervals. The first and second counters are coupled to the detected IR carrier signal and count when the detected IR carrier signal is "high" and "low" respectively. The first and second counters count up to their designated upper limits (e.g., 8 and 16). Whichever counter first reaches it upper limit, it resets both the counters, and it also sets or resets, respectively, an envelope status flip flop indicating the presence or absence of the IR carrier signal. The output of the envelope status flip flop is then provided to the next stage for bit and message decoding.

IN THE DRAWINGS

FIG. 1 is the schematic block diagram of an envelope detection apparatus in accordance with the present invention; and FIGS. 2 and 3 are the timing diagrams associated with the FIG. 1 envelope detection apparatus.

DETAILED DESCRIPTION

Figure 1:
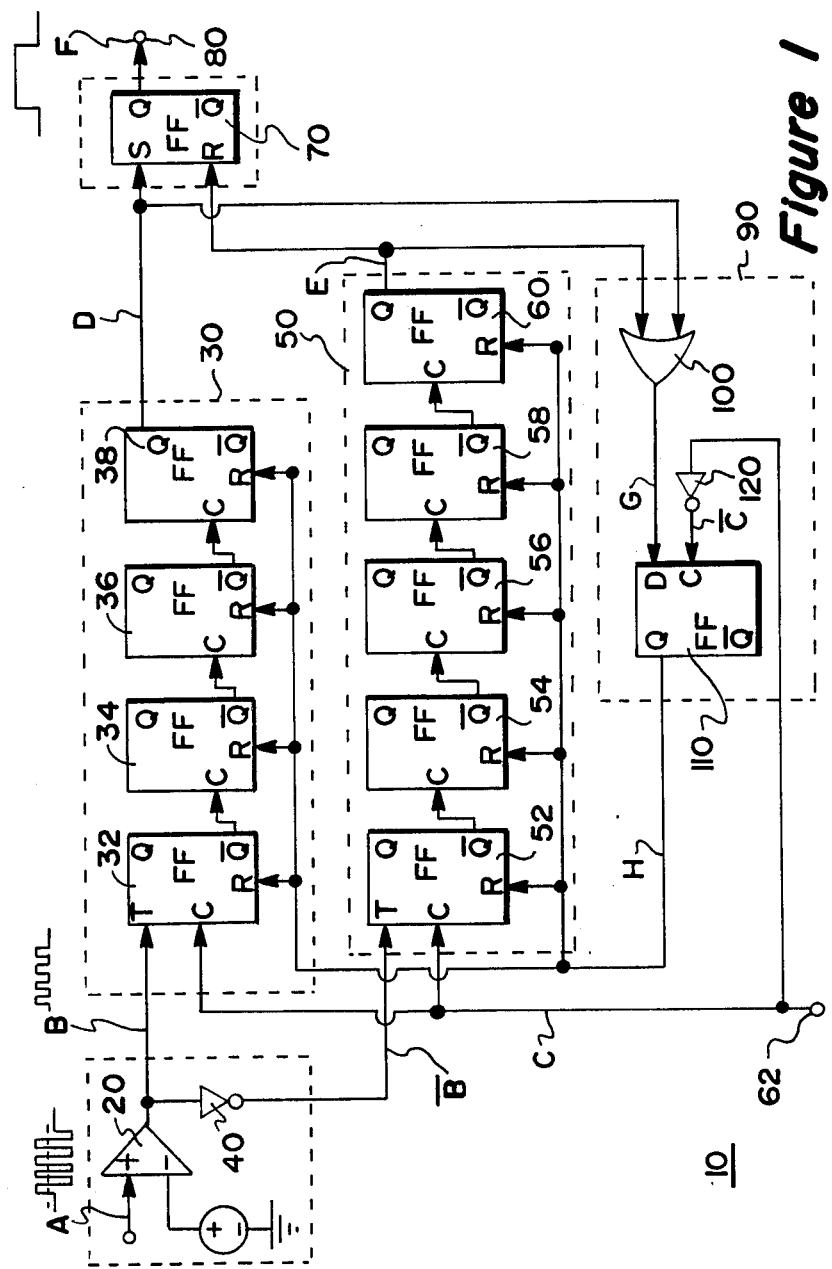

Referring to FIG. 1, the detected IR carrier signal, consisting of bursts of fixed frequency signal, is applied to one of the input terminals of a two-input comparator 20 of the subject envelope detection apparatus 10 in the manner shown in FIG. 1. The comparator 20 is arranged as a threshold detector. A fixed voltage (e.g., 1.6 volts) is applied to the second input terminal of the comparator 20. The output B of the comparator 20 is applied to the enable or toggle input of a 4-stage counter 30. The comparator output B is complemented by an inverter 40, and the inverted value $\overline{B}$ thereof is provided to the enable or toggle input of a 5-stage counter 50. The comparator 20 serves to convert the detected input IR carrier signal to a bilevel signal having logic levels suitable for energizing the counters 30 and 50.

Figure 2:
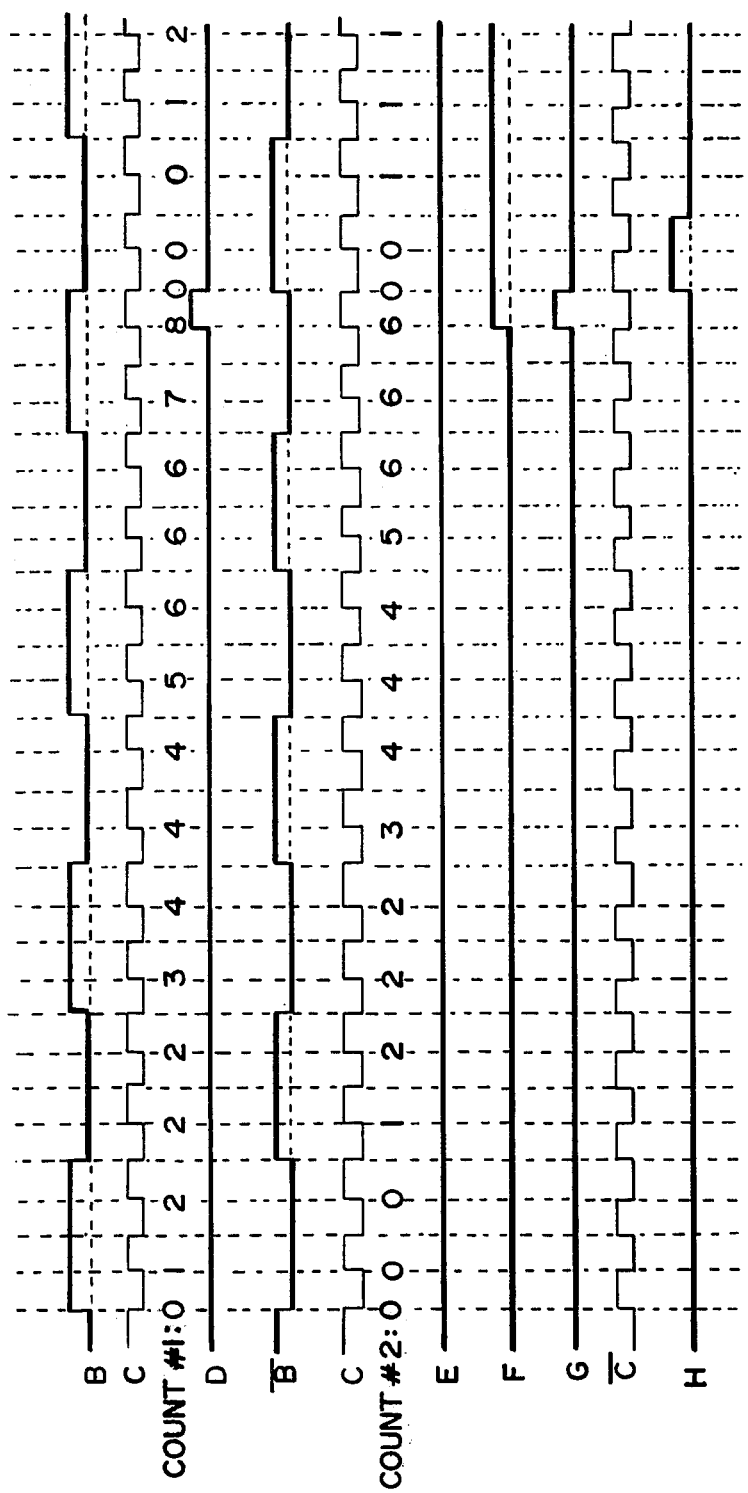
Figure 3:
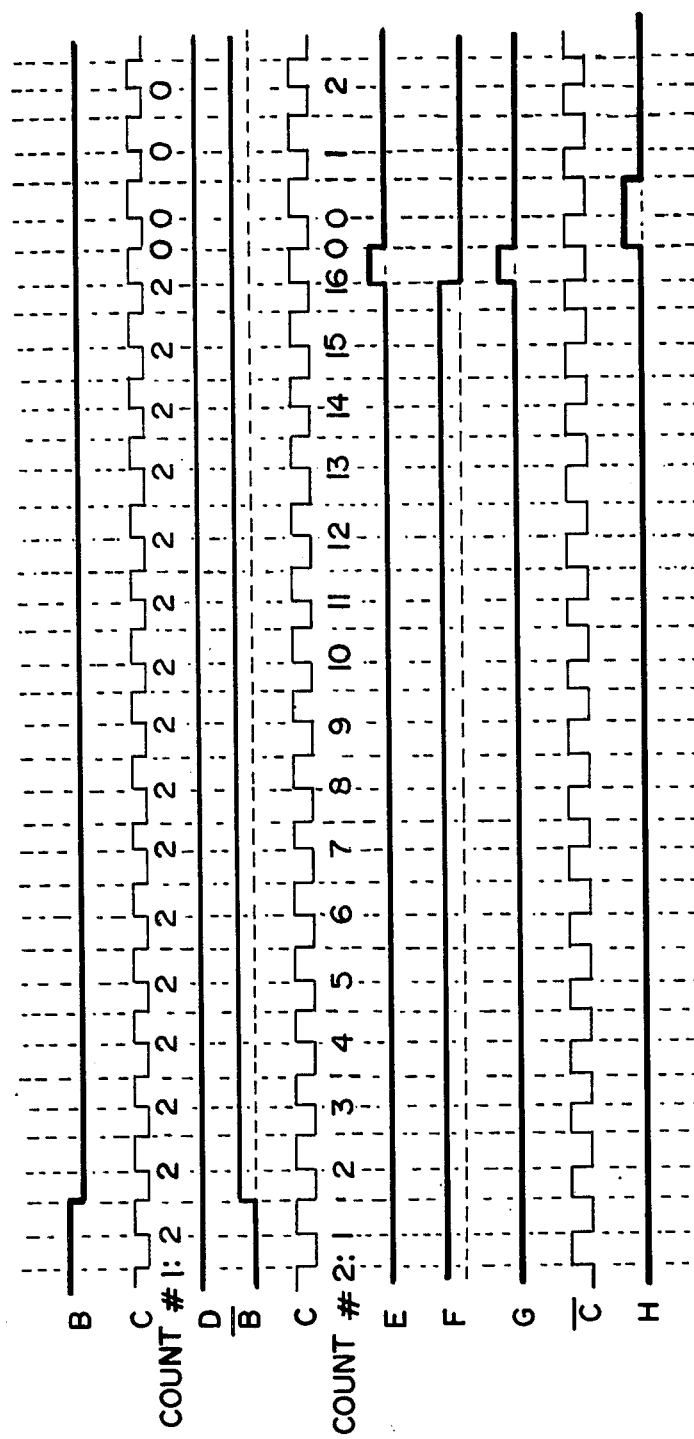

It is noted that the values B, C, D, etc., on the respective interconnecting lines in FIG. 1 are represented by the corresponding waveforms B, C, D. etc., in FIGS. 2 and 3.

A clock signal C, having a frequency of 250 KHz and a period of 4 $\mu$s, is developed by a clock signal generator 62 and applied to the clock inputs of both the counters 30 and 50. The counters 30 and 50 count the clock pulses when the detected IR carrier signal B is respectively "high" and "low", as can be seen from the timing diagrams in FIGS. 2 and 3.

Although the clock frequency used in this particular embodiment in 250 KHz (which is about 4 times the carrier frequency of 56.875 KHz), it will be apparent to those skilled in the art that any other clock frequency may be used, provided that it is a suitable multiple of the carrier frequency.

The 4-stage counter 30 consists of 4 flip flops 32, 34, 36 and 38 connected together in series to form a frequency divider, which develops an output signal for 8 clock pulses occurring during periods when signal B is high. The 5-stage counter 50, on the other hand, is composed of five flip flops 52, 54, 56, 58 and 60 connected to each other in cascade to form an up-counter, which develops an output signal for 16 clock pulses occurring during periods when signal B is "low".

As previously indicated, the 4-stage and 5-stage counters 30 and 50 count up to their respective upper limits of 8 and 16 before they are reset. The choice of the upper limits depends upon a number of considerations—such as the duty cycle of the IR carrier signal, the noise immunity, the response time and the ease of implementation. The selected values of the upper limits of 8 and 16 for the respective counters 30 and 50 reflect the 50% duty cycle of the IR carrier signal, the desired tradeoff between the noise immunity and the speed for this particular application, and a relatively straight-forward implementation of the logic.

The outputs D and E of the respective counters 30 and 50 are applied to the set and reset inputs of an envelope status, set/reset flip flop 70. When the output D of the last flip flop 38 of the 4-stage counter 30 goes "high", the envelope status flip flop 70 produces a logical "high" at its output terminal 80, as shown by the waveform F in FIG. 2. On the other hand, when the output E of the last flip flop 60 of the 5-stage counter 50 goes "high", the envelope status flip flop 70 produces a logical "low" on the output terminal 80, as indicated by the line F in FIG. 3.

Thus, the output of the envelope status flip flop 70 is "high" or "low"—respectively indicating the presence and absence of the detected IR carrier envelope—depending upon whether the 4-stage counter 30 or the 5-stage counter 50 first reaches its respective upper limit of 8 or 16 (i.e., first develops an output signal on the output connections D or E).

Furthermore, whenever one of the counters 30 and 50 reaches its designated upper limit of 8 or 16, both the counters are reset to an initial or zero condition. The counters 30 and 50 are reset by a counter resetting means 90 consisting of a two-input OR gate 100 and a D-type flip flop 110. The output lines D and E of the counters 30 and 50 are applied to the respective inputs of the two-input OR gate 100. The OR gate 100 produces a logical "high" on its output line G whenever either the input line D or the input line E is "high". The output of the OR gate 100 is provided to the D-input terminal of the reset flip flip 110 which is clocked at 4 µs interval by the clock signal $\overline{C}$. The clock signal C is complemented by an inverter 120, and the inverted value $\overline{C}$ thereof is applied to the clock input of the reset flip flop 110. Resetting of the counters 30 and 50 thus occurs on the falling edge of the clock signal, while the counting occurs on its rising edge.

The reset pulse on the output line H of the D-type flip flop 110 resets both the counters 30 and 50, including the respective output lines D and E, to zero. As soon as the reset pulse is removed, the counters 30 and 50 resume counting when they are enabled.

It is noted that the output of the envelope status flip flop 70 goes "high", indicating the presence of the IR carrier envelope, when the 4-stage counter 30 counts 8 clock pulses. Since the counter 30 counts only when the detected IR carrier signal is "high", it initially takes approximately 4 cycles of the carrier signal or about 70.4 µs (i.e., 17.6×4) for the output line D of the counter 30 to go "high" and drive the output F of the envelope status flip flop 70 "high", as shown in the timing diagram in FIG. 2.

When the detected IR carrier signal is removed, it also takes about the same time, i.e., approximately 70.4 µs, for the output E of the 5-stage counter 50 to go "high", and reset the output F of the envelope status flip flop 70 to "low", thereby indicating the disappearance of the detected IR carrier signal. This is so because although the 5-stage counter 50 has to count 16 clock pulses (instead of 8) to reset the envelope status flip flop 70, it counts continuously in the manner illustrated in FIG. 3, since the input $\overline{B}$ to the enable gate of the counter 50 is continuously "high" (as compared to being high only half the time when the detected IR signal is present).

Thus, it takes about the same amount of time for the envelope detection apparatus 10 to respond to the presence of the detected IR carrier signal, as it takes the subject apparatus to respond to the absence thereof.

Once the output of the envelope status flip flop 70 goes "high", it remains continuously in the "high" or set condition while the detected IR carrier signal is present. The 4-stage counter 30 consistently develops an output signal before the 5-stage counter 50 as long as the detected IR carrier signal is present, thereby preventing the counter 50 from resetting the envelope status flip flop 70.

The opposite is true when the detected IR carrier signal is absent. The 5-stage counter 50 consistently reaches the count of 16 before the 4-stage counter reaches the count 8 as long as the detected IR carrier signal is absent, whereby the counter 30 is prevented from setting the envelope status flip flop 70.

Several modifications to the envelope detection apparatus 10 of FIG. 1 are possible without departing from the scope of the subject invention. For example, it is possible to eliminate one flip flop stage from each of the counters 30 and 50, and to use the combinatorial logic (e.g., multi-input AND or NOR gates) to detect when the counters reach the respective highest possible count of 7 (i.e., 111) and 15 (i.e., 1111). When the highest count is reached, the envelope status flip flop 70 can be then set or reset depending upon whether the "high" counter 30 or the "low" counter 50 first reaches its highest count. Simultaneously, both counters 30 and 50 can be reset to zero.

In addition, other known threshold detectors may be implemented in the place of the comparator 20 and the resetting flip flop 110 may be replaced, for example, by a delay stage, etc.

What is claimed is:

1. Digital signal processing apparatus for detecting the presence of a carrier signal occurring at a given frequency; said signal processing apparatus comprising:
   a source of a pulsed clock signal occurring at a rate which is a multiple of said carrier signal frequency;
   first means for counting said clock pulses when said carrier signal is "high"; said first counting means having an upper limit;
   second means for counting said clock pulses when said carrier signal is "low"; said second counting means having a different upper limit;
   means responsive to said first and second counting means for generating a signal representative of the envelope of said carrier signal; said envelope generating means producing a first and a second output depending upon whether said first or said second counting means first reaches its respective upper limit; and
   means for resetting both of said counting means to zero whenever either one of said counting means reaches its respective upper limit.

2. The digital signal processing apparatus as defined in Claim 1 wherein said first counting means comprises a first plurality of flip flops connected together in series as an up-counter; wherein the first one of said first plurality of flip flops is a toggle flip flop with said carrier signal applied to the toggle input of said toggle flip flop and said clock signal applied to the clock input thereof; the output of the last one of said flip flops being coupled to the respective inputs of said envelope generating means and said resetting means.

3. The digital signal processing apparatus as defined in claim 2 wherein said second counting means comprises a second plurality of flip flops connected to each other in series as an up-counter; wherein the first one of said second plurality of flip flops is a toggle flip flop having the inverted value of said carrier signal applied to the toggle input thereof and said clock signal applied to its clock input; the output of the last one of said second plurality of flip flops being coupled to the respective inputs of said envelope generating means and said resetting means.

4. The digital signal processing apparatus as defined in claim 3 wherein said first counting means is a four-stage counter having a set of four flip flops; wherein said second counting means is a five-stage counter having a set of five flip flops; wherein said upper limits of said first and second counting means are respectively eight and sixteen.

5. The digital signal processing apparatus as defined in claim 1 wherein said envelope generating means comprises a set/reset flip flop having the outputs of said first and second counting means applied to the set and reset inputs thereof respectively.

6. The digital signal processing apparatus as defined in claim 1 wherein said resetting means comprises:

a two-input OR gate having the outputs of said first and second counting means applied to the respective inputs thereof; and a D-type flip flop having the output of said OR gate coupled to the D-input thereof, and having said clock signal coupled to its clock input; the output of said D-type flip flop being applied to the respective reset inputs of said first and second counting means.

7. The digital signal processing apparatus as defined in claim 6 wherein the inverted value of said clock signal is fed to said clock input of said D-type flip flop.

8. The digital signal processing apparatus as defined in claim 1 wherein said carrier signal rate is equal to 56.875 KHz.

9. The digital signal processing apparatus as defined in claim 8 wherein said clock pulse rate is 250 KHz.

10. The digital signal processing apparatus as defined in claim 1 wherein said clock pulse rate is about 4 times the carrier signal rate.

11. The digital signal processing apparatus as defined in claim 1 further including a two input comparator; wherein said carrier signal is applied to the first input of said comparator; wherein a threshold voltage is fed to the second input of said comparator; wherein the output of said comparator is coupled to said first and second counting means.

12. Digital signal processing apparatus for detecting the presence of a fixed frequency signal which signal is substantially in the form of a bilevel signal having alternate relatively high and relatively low states, said signal processing apparatus comprising:

a terminal for applying said fixed frequency signal;

a source of pulsed clock signal occurring at a rate which is greater than the frequency of said fixed frequency signal;

first means coupled to said terminal and said source for developing an output signal for a first predetermined number of clock pulses occurring when said fixed frequency signal is relatively high;

second means coupled to said terminal and said source for developing an output signal for a second predetermined number of clock pulses occurring when said fixed frequency signal is relatively low; said second predetermined number being different from said first predetermined number;

means responsive to said first and second means for generating a signal representative of the envelope of said fixed frequency signal; said envelope generating means producing a signal having a first output state for said first means developing an output signal before said second means, and producing a second output state for said second means developing an output signal before said first means; and means for resetting both of said first and second means whenever either one of said first and second means develops an output signal.

* * * * *